United States Patent [19]
Banerjee et al.

[11] Patent Number: 5,444,602
[45] Date of Patent: Aug. 22, 1995

[54] ELECTRONIC PACKAGE THAT HAS A DIE COUPLED TO A LEAD FRAME BY A DIELECTRIC TAPE AND A HEAT SINK THAT PROVIDES BOTH AN ELECTRICAL AND A THERMAL PATH BETWEEN THE DIE AND THE LEAD FRAME

[75] Inventors: Koushik Banerjee, Chandler; Siva Natarajan, Gilbert; Debendra Mallik, Chandler; Praveen Jain, Gilbert, all of Ariz.

[73] Assignee: Intel Corporation, Santa Clara, Calif.

[21] Appl. No.: 201,895

[22] Filed: Feb. 25, 1994

[51] Int. Cl.⁶ .................................................. H05K 7/20
[52] U.S. Cl. .................................... 361/705; 174/52.4; 257/675; 361/723
[58] Field of Search ............... 257/675, 706, 707, 712, 257/713; 165/80.3, 185; 174/16.3, 52.2, 52.4; 361/749, 776, 813, 704, 705, 712, 717–719, 723

[56] References Cited

U.S. PATENT DOCUMENTS

| | | | |
|---|---|---|---|
| 4,802,532 | 2/1989 | Dawes | 165/80.3 |
| 4,807,018 | 2/1989 | Cellai | 357/70 |
| 5,065,281 | 11/1991 | Hernandez | 361/388 |
| 5,105,259 | 4/1992 | McShane | 357/72 |
| 5,172,213 | 12/1992 | Zimmerman | 257/796 |
| 5,262,925 | 11/1993 | Matta | 361/749 |
| 5,334,872 | 8/1994 | Ueda | 257/675 |
| 5,365,409 | 11/1994 | Kwon | 361/813 |

Primary Examiner—Gerald P. Tolin
Attorney, Agent, or Firm—Blakely, Sokoloff, Taylor & Zafman

[57] ABSTRACT

An electronic package has a heat sink that is attached to the lead frame of the package with a material that is both electrically and thermally conductive. The lead frame is also coupled to a first surface of an integrated circuit die with tape automated bonded (TAB) leads. The low thermal resistance of the heat sink increases the thermal performance of the package. The heat sink may also be mounted directly to the die with a conductive material so that the die is electrically grounded to the heat sink. The heat sink is then bonded to the leads of the lead frame that are dedicated to ground. In this embodiment, the heat sink provides the dual functions of a ground plate and a heat spreader.

4 Claims, 2 Drawing Sheets

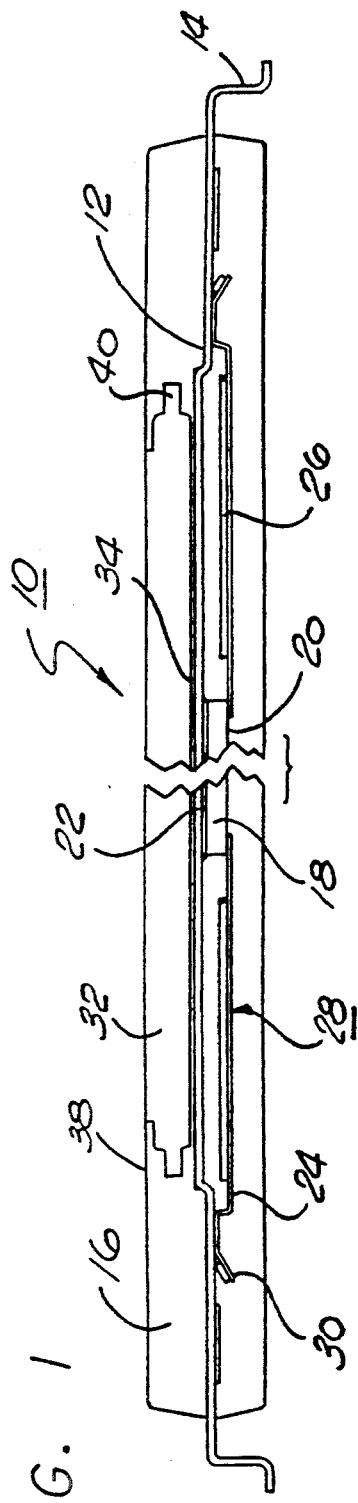
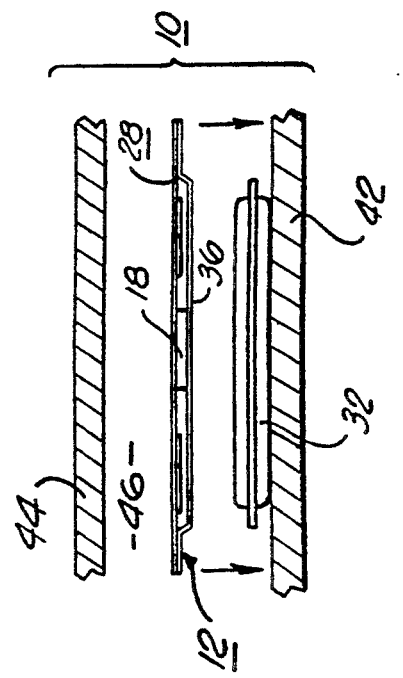
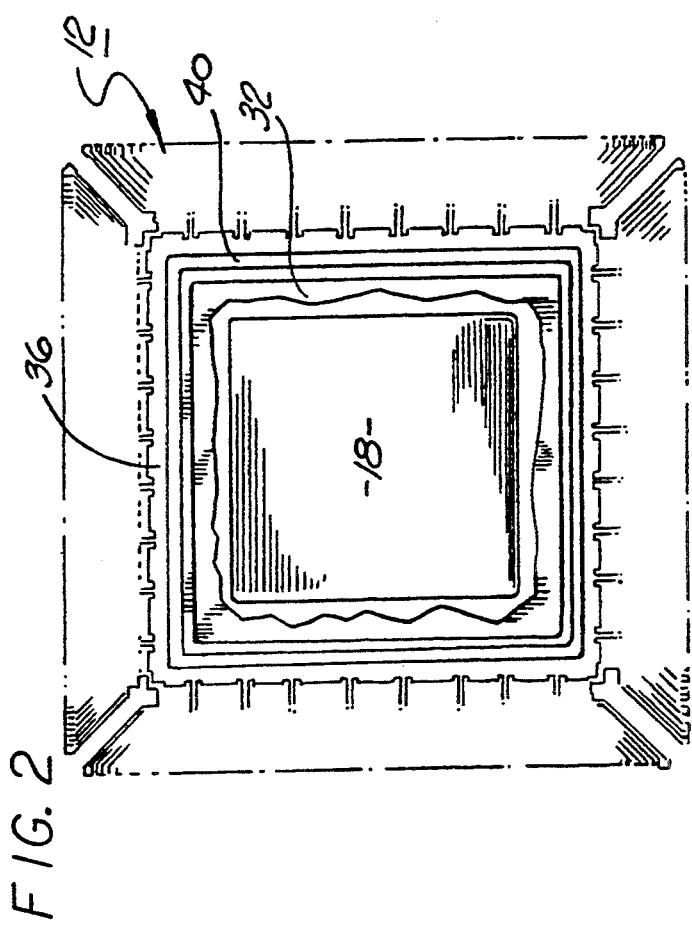

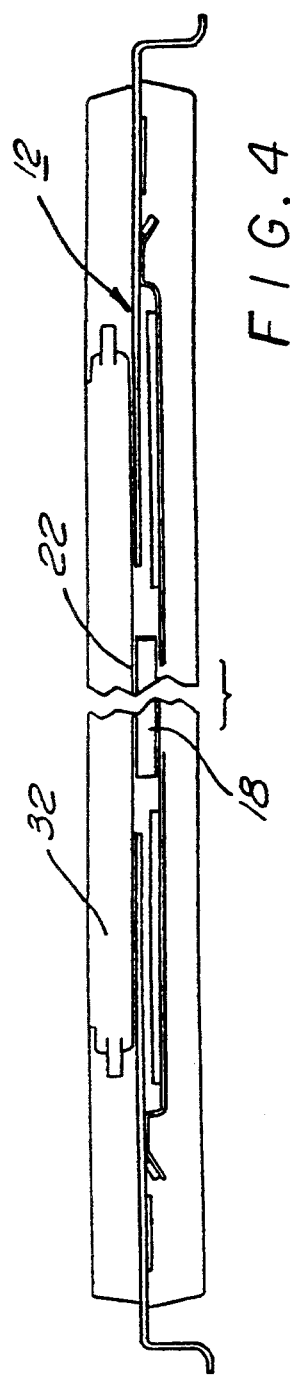
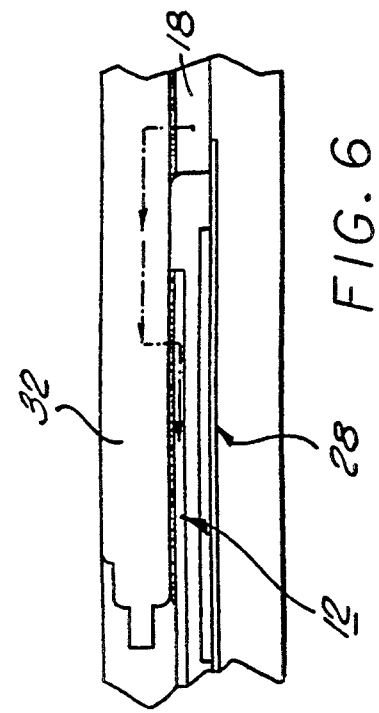
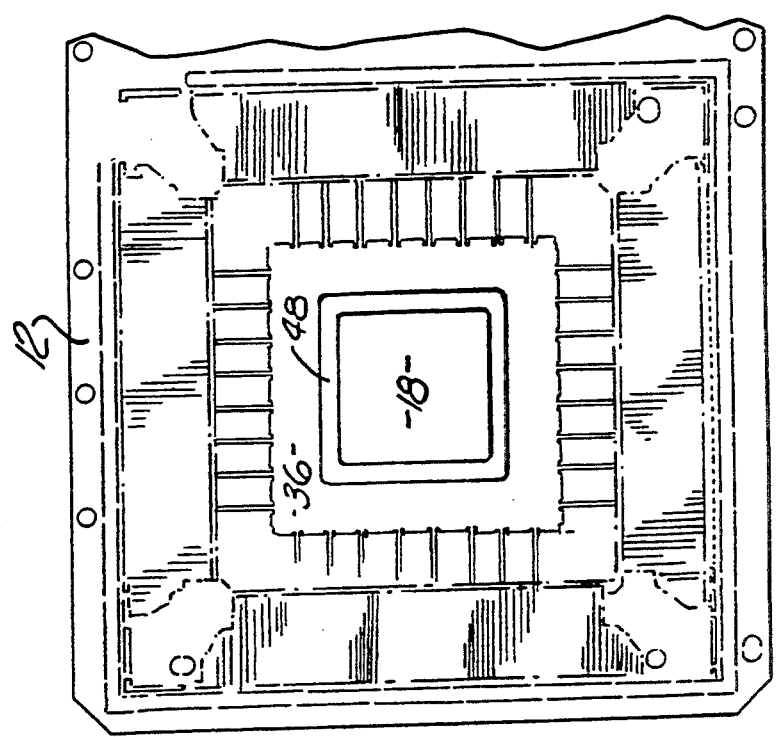

ELECTRONIC PACKAGE THAT HAS A DIE COUPLED TO A LEAD FRAME BY A DIELECTRIC TAPE AND A HEAT SINK THAT PROVIDES BOTH AN ELECTRICAL AND A THERMAL PATH BETWEEN THE DIE AND THE LEAD FRAME

BACKGROUND OF THE INVENTION

1. Field of the Invention

The present invention relates to an electronic package.

2. Description of Related Art

Integrated circuits (ICs) are typically housed within a package that can be mounted to a printed circuit board. A conventional IC package includes an outer housing that encapsulates the integrated circuit and a lead frame that couples the circuit to the printed circuit board. The outer housing is typically constructed from a dielectric material such as a glass filled epoxy. Glass filled epoxies have a relatively low coefficient of thermal conductivity. Consequentially, a substantial portion of the heat generated by the integrated circuit is transferred to the printed circuit board through the lead frame. The leads of the lead frame are relatively long and create a thermal resistance that may cause excessive junction temperatures in the IC. High junction temperatures may damage or otherwise effect the performance of the circuit.

Conventional electronic packages are typically constructed with a predetermined number of leads (pins). For example, electronic packages commonly referred to as quad flat packs (QFP) may be constructed to have 100 or 120 pins. The power, ground and input/output (I/O) of the integrated circuit are dedicated to specific pins of the package. For a 100 pin package, 64 pins may be dedicated to I/O, 18 pins may be dedicated to power and 18 pins may be dedicated to ground. High density integrated circuits such as a microprocessor require a relatively large amount of power. High power IC's require a large number of power and ground to decrease the overall electrical and thermal resistance of the leads. Dedicating additional leads to power and ground reduces the number of I/O pins for the package. It would be desirable to provide an electronic package for an I/C that has relatively high thermal and electrical requirements without decreasing the I/O throughput of the package. It would also be desirable to provide an efficient electronic package that was simple to assemble and inexpensive to produce.

SUMMARY OF THE INVENTION

The present invention is an electronic package which has a heat sink that is attached to the lead frame of the package with a material that is both electrically and thermally conductive. The lead frame is also coupled to a first surface of an integrated circuit die with tape automated bonded (TAB) leads. The low thermal resistance of the heat sink increases the thermal performance of the package. The heat sink may also be mounted directly to the die with a conductive material so that the die is electrically grounded to the heat sink. The heat sink is then bonded to the leads of the lead frame that are dedicated to ground. In this embodiment, the heat sink provides the dual functions of a ground plate and a heat spreader.

It is therefore an object of the present invention to provide an electronic package which is more thermally and electrically efficient than packages in the prior art.

BRIEF DESCRIPTION OF THE DRAWINGS

The objects and advantages of the present invention will become more readily apparent to those ordinarily skilled in the art after reviewing the following detailed description and accompanying drawings, wherein:

FIG. 1 is a cross-sectional view of an electronic package of the present invention;

FIG. 2 is a top view of a lead frame mounted to a die and a heat sink;

FIG. 3 is a cross-sectional view of a lead frame and a die mounted to a heat sink located within a mold;

FIG. 4 is a cross-sectional view of an alternate embodiment of the electronic package of FIG. 1;

FIG. 5 is a top view of the lead frame of FIG. 4 mounted to the die and the heat sink;

FIG. 6 is a cross-sectional view showing the current flow through the package of FIGS. 4 and 5.

DETAILED DESCRIPTION OF THE INVENTION

Referring to the drawings more particularly by reference numbers, FIG. 1 shows an electronic package 10 of the present invention. The package 10 includes a lead frame 12 which has a plurality of leads 14. A portion of the leads 14 extend from a package housing 16. The exposed portion of the leads 14 are typically soldered to a printed circuit board (not shown), as is known in the art. The housing 16 is typically constructed from a dielectric plastic material which can be injected into a mold. The basic configuration of the package 10 is typically referred to as a quad flat pack (QFP). Although a QFP is described and shown, it is to be understood that the present invention can be used in other types of electronic packages.

The package 10 includes an integrated circuit die 18 which has a first surface 20 and a second opposite surface 22. The first surface 20 contains a number of surface bonding pads that provide the output pins of the integrated circuit. The first surface 20 of the die 18 is coupled to the lead frame 12 by a plurality of leads 24 which are bonded to both the surface bonding pads of the die 18 and the leads of the lead frame 12. In the preferred embodiment, the leads 24 are attached to a dielectric tape 26 which together are commonly referred to as a TAB (tape automated bonding) tape 28. The tape 26 provides structural support for the leads so that the leads can be bonded to the lead frame 12 and die pads in one step. The TAB tape 28 may have an additional outer strip 30 of polyimide which provides structural support for the ends of the leads 24.

A heat sink 32 is mounted to the lead frame 12 adjacent to the second surface 22 of the die 18. In the preferred embodiment, the heat sink 32 is bonded to the lead frame 12 with a silver filled epoxy 34 which is both thermally and electrically conductive. As shown in FIG. 2, the heat sink 32 and die 18 are preferably mounted to the die paddle 36 of the lead frame 12. The die paddle 36 is coupled to the leads of the frame lead 12 that are dedicated to electrical ground. The die 18 is therefore electrically and thermally grounded to the heat sink 32.

The heat sink 32 is preferably constructed from a thermally conductive material such as copper or anodized aluminum. As shown in FIG. 1, the heat sink 32 extends from the lead frame 12 to the top surface 38 of the housing 16. The heat can be removed from the top surface 38 by either natural or forced convection. The heat sink 32 provides a heat path from the die 18 to the top of the package 10 which has a relatively low thermal resistance. The lower thermal resistance provides a corresponding lower junction temperature within the integrated circuit 18. The heat sink 32 preferably has an outer flange 40 embedded into the housing 16. The outer flange 40 secures the sink 32 to the package 10.

As shown in FIG. 3, the package 10 can be assembled by first placing the heat sink 32 within a mold 42. At a separate station the lead frame 12 and TAB leads 24 are bonded to the integrated circuit 18. The die 18 is also bonded to the die paddle 36 of the lead frame 12 with a electrically conductive adhesive, such as a silver filled epoxy. An uncured thermally and electrically conductive adhesive, such as the silver filled epoxy 34 described above, is applied to the surface of the heat sink 32. The lead frame 12 and die 18 are then mounted to the heat sink 32 by placing the die paddle 36 onto the sink 32. The epoxy 34 is then cured.

Although the process of mounting the lead frame 12 and die 18 to the heat sink 28, and curing the epoxy, is described and shown as occurring within the mold 38, it is to be understood that the heat sink 32 may be bonded to the die paddle 36 outside of the mold 42. It is also to be understood that the package of the present invention can be constructed by first mounting the heat sink 32 to the die 18 before the lead frame 18 and TAB leads 24 are bonded to the die 18.

After the lead frame 12 is bonded to the heat sink 32, a mold cover 44 is assembled to the mold base 42 to enclose the die 18, heat sink 32 and a portion of the lead frame 12. The mold base 42 and cover 44 define a mold cavity 46. The mold cavity 46 is injected with a dielectric plastic material. The plastic is allowed to cure and the mold is removed, wherein there is created an electronic package 10 of the preset invention. The heat sink 32 may have a step 46 which allows the cured housing material to expand to a location flush with the top of the heat sink 32.

FIG. 4 shows an alternate embodiment of the electronic package, wherein the heat sink 32 is mounted to the lead frame 12 and the second surface 22 of the die 18. The heat sink 32 is mounted to both the lead frame 12 and the die 18 with a thermally and electrically conductive adhesive such as a silver filled epoxy. As shown in FIG. 5, the die paddle 36 of the lead frame 12 has an opening 48 that provides clearance for the die 18 to be mounted to the heat sink 32. The die 18 is also mounted to the die paddle 32 with a conductive adhesive such as the silver filled epoxy.

As shown in FIG. 6, by electrically coupling the heat sink 32 with both the die 18 and the lead frame 12, current can flow from the die 18, through the heat sink 36 and into the die paddle 36. The die paddle 36 is connected to leads 14 of the lead frame 12 that are dedicated to ground. The heat sink 32 thus provides a large ground plate for the die 18, which reduces the resistance and improves the electrical performance of the package 10.

The package shown in FIG. 4 is assembled in the same manner as the package shown in FIG. 1, with the additional step of bonding the heat sink 32 directly to the die 18. What is thus provided is a heat sink 32 that is coupled to the integrated circuit die, such that the heat sink 32 provides the dual function of a ground plate and a thermal spreader.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic package, comprising:
    a housing that has a top surface;
    a die within said housing, said die having a first surface and a second opposite surface;
    a dielectric tape which has a plurality conductive of leads attached to said first surface of said die;
    a lead frame that has a plurality of leads that extend from said housing and which are connected to said conductive leads of said dielectric tape;
    a thermally conductive metal heat sink mounted to said lead frame, said metal heat sink being adjacent to said second surface of said die and extending to said top surface of said housing;
    a conductive adhesive that thermally and electrically couples said die to said heat sink and said lead frame to create an electrical and thermal path from said die to said lead frame through said heat sink.

2. The package as recited in claim 1, wherein said heat sink has an outer flange that is embedded into said housing.

3. An electronic package, comprising:
    a housing that has a top surface;
    a die within said housing, said die having a first surface and a second opposite surface;
    a dielectric tape which has a plurality of conductive leads attached to said first surface of said die;
    a lead frame that has a plurality of leads that extend from said housing and which are connected to said conductive leads of said dielectric tape; and,
    a thermally conductive metal heat sink that is mounted to said second surface of said die and which extends to said top surface of said housing;
    a conductive adhesive that thermally and electrically couples said die to said heat sink and said lead frame to create an electrical and thermal path from said die to said lead frame through said heat sink.

4. The package as recited in claim 3, wherein said heat sink has an outer flange that is embedded into said housing.

* * * * *